(12) United States Patent
Park

(10) Patent No.: US 7,828,487 B2
(45) Date of Patent: Nov. 9, 2010

(54) POST-EXPOSURE BAKING APPARATUS AND RELATED METHOD

(75) Inventor: Jeong-Hun Park, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1168 days.

(21) Appl. No.: 11/476,639

(22) Filed: Jun. 29, 2006

(65) Prior Publication Data
US 2007/0003279 A1   Jan. 4, 2007

(30) Foreign Application Priority Data
Jun. 29, 2005   (KR)   ........... 10-2005-0057241

(51) Int. Cl.
G03D 5/00   (2006.01)
F28F 7/00   (2006.01)
F25D 23/02  (2006.01)

(52) U.S. Cl. ............... 396/611; 165/80.4; 165/218; 165/267

(58) Field of Classification Search ............. 396/611; 165/80.4, 218, 267
See application file for complete search history.

(56) References Cited

U.S. PATENT DOCUMENTS

| 5,789,141 | A  | * | 8/1998  | Usujima ............... 430/313 |
| 5,943,880 | A  | * | 8/1999  | Tateyama ............... 62/434 |
| 6,579,731 | B2 | * | 6/2003  | Yun ....................... 438/14 |
| 6,700,099 | B2 | * | 3/2004  | Cole et al. ........... 219/444.1 |
| 6,919,913 | B1 | * | 7/2005  | Inada et al. ............ 348/61 |
| 6,963,789 | B2 | * | 11/2005 | Bun et al. ............ 700/121 |
| 2001/0041229 | A1 | * | 11/2001 | Sakamoto et al. ....... 427/555 |
| 2002/0092471 | A1 | * | 7/2002  | Kang et al. ............ 118/715 |
| 2004/0179337 | A1 | * | 9/2004  | Lee et al. ............. 361/700 |
| 2006/0004493 | A1 | * | 1/2006  | Hwang et al. .......... 700/300 |
| 2006/0113290 | A1 | * | 6/2006  | Shareef et al. ....... 219/121.82 |
| 2006/0183340 | A1 | * | 8/2006  | Hayashida et al. ..... 438/758 |
| 2009/0211742 | A1 | * | 8/2009  | Lee et al. ............. 165/168 |

FOREIGN PATENT DOCUMENTS

| JP | 61023321 A | * | 1/1986 |
| JP | 2000-349018 |   | 12/2000 |
| KR | 1020000002042 |   | 1/2000 |
| KR | 1020010018339 |   | 3/2001 |

* cited by examiner

*Primary Examiner*—Amanda C. Walke
(74) *Attorney, Agent, or Firm*—Volentine & Whitt, PLLC

(57) ABSTRACT

A post-exposure baking apparatus comprising a supporting member, a heating member, and a cooling member is disclosed. A wafer is disposed on the supporting member and a photoresist layer is formed on the wafer. The heating member comprises electrical heating wires and is adapted to apply heat to the wafer to chemically amplify an acid generated in the photoresist layer through an exposure process using deep ultraviolet light. The cooling member is adapted to cool an outer edge of the wafer to suppress the amplification of the acid at the outer edge of the wafer.

18 Claims, 9 Drawing Sheets

POST-EXPOSURE BAKING APPARATUS AND RELATED METHOD

BACKGROUND

1. Field of the Invention

Embodiments of the invention relate to a semiconductor device manufacturing apparatus and a method for fabricating a semiconductor device. More particularly, embodiments of the invention relate to an apparatus adapted to bake a wafer and a related method.

This application claims priority to Korean Patent Application 2005-57241, filed on Jun. 29, 2005, the subject matter of which is hereby incorporated by reference in its entirety.

2. Description of the Related Art

Semiconductor devices are manufactured through a complex series of fabrication processes such as cleaning, deposition, photolithography, etching, and ion implantation processes. A photolithography process adapted to form patterns on a wafer is critical to the formation of highly integrated semiconductor devices.

In general, systems adapted to perform photolithography comprise a coating apparatus, an exposure apparatus, a developing apparatus, and a plurality of baking apparatuses. The exposure apparatus performs an exposure process in which the exposure apparatus irradiates light onto the photoresist layer formed on the wafer. By irradiating light onto the photoresist layer, the exposure apparatus transforms properties of various regions of the photoresist layer, and thus forms "altered photoresist regions" in the photoresist layer. Deep ultra-violet light has recently been replacing the conventional i-line type light as the light used by the exposure process as design rules for contemporary semiconductor devices have been scaled down.

When deep ultraviolet light is used in the exposure process, the post-exposure baking process is indispensable in the fabrication of the semiconductor device. By heating a wafer on which the exposure process was performed, the post-exposure baking process further transforms properties of regions of the photoresist layer by amplifying the acid generated in the photoresist layer. The amount that the acid in the photoresist layer is amplified, and thus, the respective dimensions of the altered photoresist regions after the post-exposure baking process is performed, depends upon the temperature at which the wafer is heated during the post-exposure baking process. When the wafer is heated at an insufficient temperature (i.e., a temperature that is too low), the acid amplification is suppressed and only narrow altered photoresist regions are formed.

While light is irradiated precisely onto a central region of the wafer during photolithography, light may also be broadly irradiated onto edge regions of the wafer for various reasons. For example, a wafer seated on a vacuum wafer chuck may be slightly bent, and the resulting, slightly curved surface may allow light to be irradiated on edge regions of the wafer.

In an attempt to form uniform photoresist patterns over an entire wafer, conventional post-exposure baking apparatuses have been adapted to apply heat uniformly to an entire wafer. However, during post-exposure baking process, some wider, altered photoresist regions may be formed on an edge region of a wafer due to the incident irradiation phenomenon noted above. Thus, after a development process, some portions of the remaining photoresist pattern may be more narrow than desired. Such overly narrow photoresist pattern portions may fail to adhere to wafer, but instead may break off and become loose potentially contaminating particles on the wafer.

SUMMARY OF THE INVENTION

In one embodiment, the invention provides a post-exposure baking apparatus comprising a supporting member, wherein a wafer is disposed on the supporting member and wherein a photoresist layer is formed on the wafer; a heating member comprising electrical heating wires and adapted to apply heat to the wafer to chemically amplify an acid generated in the photoresist layer through an exposure process using deep ultraviolet light; and, a cooling member adapted to cool an outer edge of the wafer to suppress the amplification of the acid at the outer edge of the wafer.

In another embodiment, the invention provides a photolithography system comprising a coating apparatus adapted to form a photoresist layer on a wafer, an exposure apparatus adapted to selectively expose the photoresist layer using deep ultraviolet light, and a developing apparatus adapted to form a photoresist pattern on an upper portion of the wafer using a development liquid. The photolithography system further comprises a plurality of baking apparatuses comprising a pre-baking apparatus, a post-exposure baking apparatus, and a hard-baking apparatus. The post-exposure baking apparatus comprises a supporting member, wherein the wafer is disposed on the supporting member; a heating member comprising electrical heating wires and adapted to apply heat to the wafer to chemically amplify an acid generated in the photoresist layer through an exposure process; and, a cooling member disposed at an edge of the wafer and adapted to suppress the amplification of the acid at the edge of the wafer.

In yet another embodiment, the invention provides a method for post-exposure baking a wafer after forming a photoresist layer on the wafer and performing an exposure process on the photoresist layer using deep ultraviolet. The method comprises applying heat to the wafer disposed on a supporting member to chemically amplify an acid generated in the photoresist layer through the exposure process, and simultaneously cooling an edge of the wafer disposed on the supporting member to suppress the amplification of the acid at the edge of the wafer.

BRIEF DESCRIPTION OF THE DRAWINGS

Exemplary embodiments of the invention will be described hereinafter with reference to the accompanying drawings, in which like reference symbols refer to like or similar elements throughout. In the drawings.

DESCRIPTION OF THE EXEMPLARY EMBODIMENTS

Figure 1:
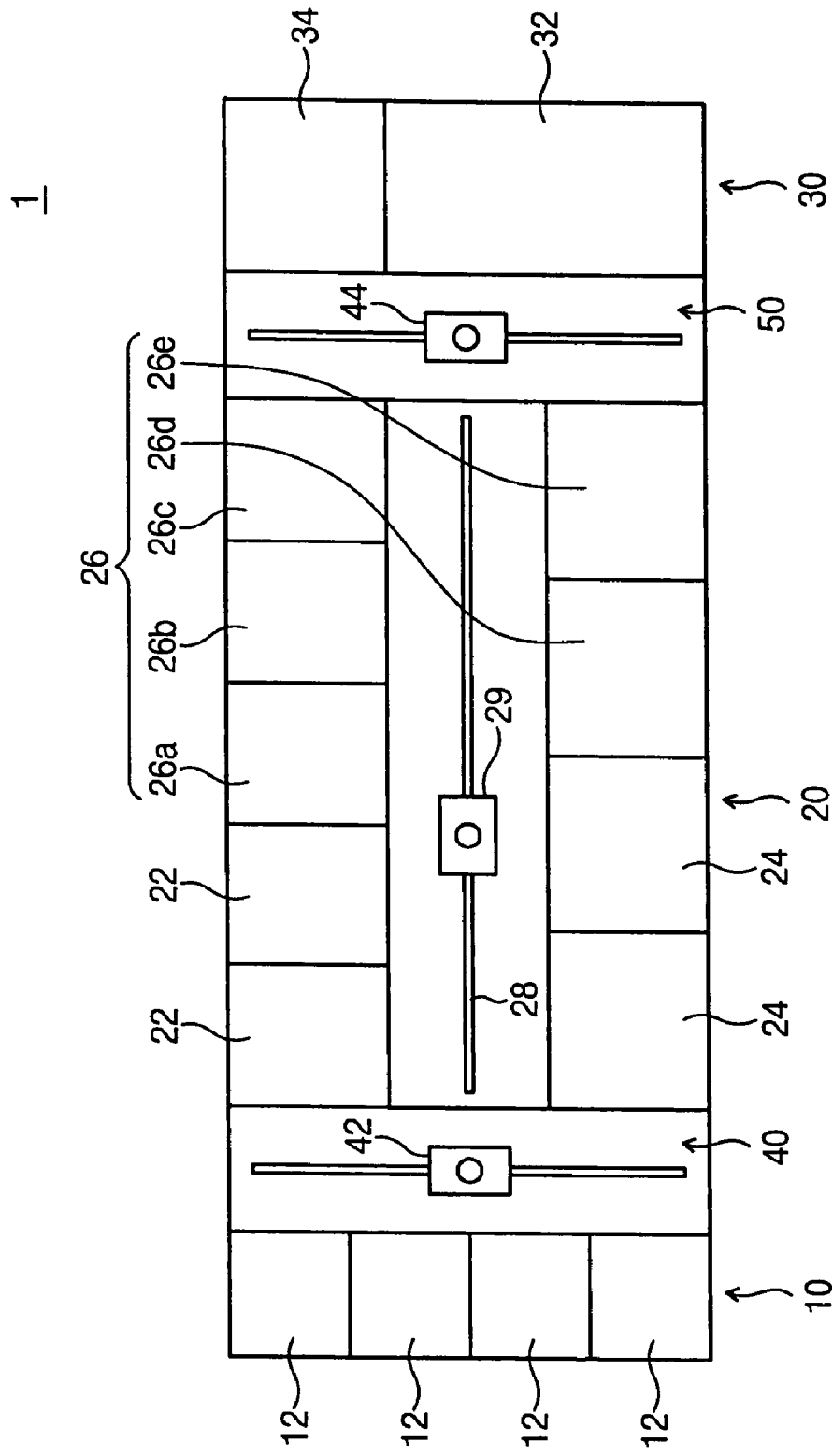
FIG. 1 is a schematic plan view of a photolithography system in accordance with an exemplary embodiment of the invention.

FIG. 1 is a schematic plan view of a photolithography system in accordance with an exemplary embodiment of the invention. A photolithography system 1 comprises a series of stages 10 sequentially arranged in a line, a coating and developing unit 20, and an exposure unit 30. Loading units 12 are mounted on the series of stages 10. A cassette housing a wafer W is disposed on a loading unit 12. Coating and developing unit 20 comprises a coating apparatus 22 adapted to perform a coating process on wafer W, a developing apparatus 24 adapted to perform a developing process, and a plurality of baking apparatuses 26. An exposure apparatus 32 is disposed on exposure unit 30. In addition, a transporting unit 40, comprising a robot 42 adapted to transport wafer W, is disposed between coating and developing unit 20 and the series of stages 10.

Coating and developing unit 20 is disposed in a straight line from a region neighboring transporting unit 40 to a region neighboring an interface unit 50. In addition, coating and developing unit 20 comprises a moving path 28 along which a robot 29 may move in a straight line. A plurality of process modules (i.e., process apparatuses) are disposed along moving path 28, wherein several process modules of the plurality of process modules are disposed along one side of moving path 28 and several are disposed along the other side. The plurality of process modules comprise a coating apparatus 22 adapted to form a photoresist layer on a wafer (i.e., coat a wafer with photoresist), a developing apparatus 24 adapted to selectively remove photoresist formed on a wafer after an exposure process, and a plurality of baking apparatuses 26.

Wafer W is transported to each of developing apparatus 24, exposure apparatus 32, and coating apparatus 22 in between being heated or cooled by the various baking apparatuses of plurality of baking apparatuses 26. Typical examples of the respective baking apparatuses are a pre-baking apparatus 26a, a soft baking apparatus 26b, a post-exposure baking apparatus 26c, a hard baking apparatus 26d, and a cooling apparatus 26e. In the illustrated embodiment, pre-baking apparatus 26a heats wafer W at a predetermined temperature to remove water and organic materials from surfaces of wafer W before a photoresist layer is formed on wafer W. Soft baking apparatus 26b operates after the photoresist layer is formed on wafer W, and post-exposure baking apparatus 26c operates after the photoresist layer is exposed with light. Hard baking apparatus 26d operates after the exposed photoresist layer has been developed, and cooling apparatus 26e cools wafer W. In addition, the plurality of baking apparatuses 26 may be stacked over each other. As used herein, when a first element is described as being stacked "over" a second element, the first element may be stacked directly over the second element, or intervening elements may be present in between the first and second elements. Also, when a layer is described as being formed "on" another element, that layer may be formed directly on the other element, or intervening elements or layers may be present.

Exposure unit 30 comprises exposure apparatus 32, which is adapted to perform an exposure process comprising irradiating light onto the photoresist layer formed on wafer W through a mask in which a pattern is formed. Exposure unit 30 may comprise a wafer edge exposure apparatus 34 adapted to irradiate light onto an end region at the edge of wafer W. In embodiments of the invention, exposure apparatus 32 uses deep ultraviolet light (DUV) (i.e., uses deep ultraviolet light as a light source). For example, a KrF excimer laser or a ArF excimer laser may be used as the light.

Photolithography system 1 may be embodied in various forms, and the structure of photolithography system 1 described above is only an exemplary structure for photolithography system 1. For example, coating and developing unit 20 may have a multi-layered structure wherein components are separated vertically, and the process modules (i.e., process apparatuses) of coating and developing unit 20 may be arranged differently. Wafer edge exposure apparatus 34 may also be disposed in interface unit 50.

The structure of post-exposure bake apparatus 26c will be described in some additional detail hereinafter. However, the respective structures of coating apparatus 22, developing apparatus 24, exposure apparatus 32, and each baking apparatus of plurality of baking apparatuses 26, except for post-exposure bake apparatus 26c, will be clear to those skilled in the art, so detailed descriptions thereof will be omitted herein.

Figure 2:
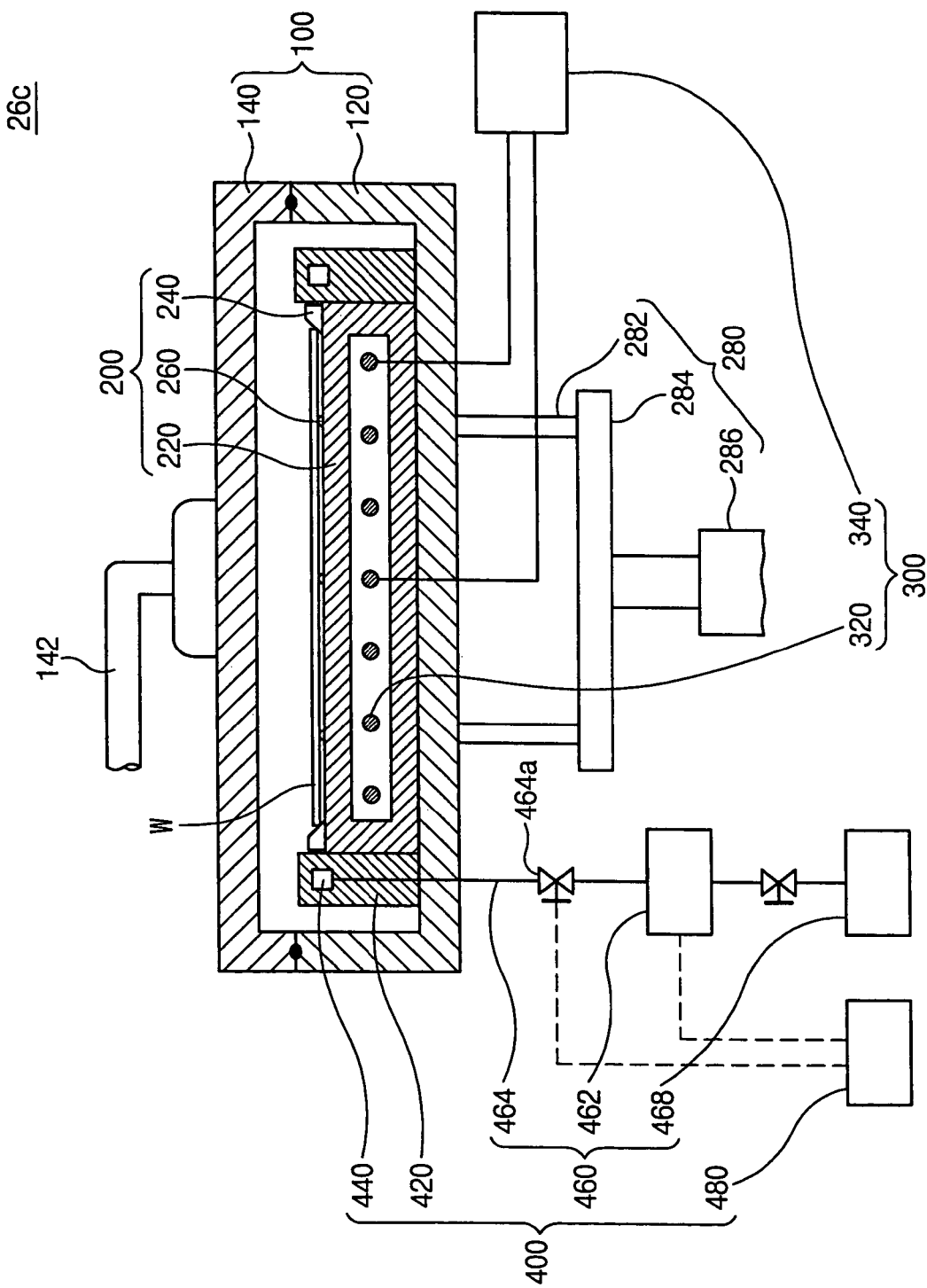
FIG. 2 is a cross-sectional view illustrating an exemplary embodiment of the post-exposure baking apparatus of FIG. 1.

Post-exposure baking apparatus 26c amplifies an acid that is generated in a photoresist layer by an exposure process. The exposure process uses deep ultraviolet light to modify chemical properties of various regions of the photoresist layer so that a development fluid will remove the photoresist in the regions of the photoresist layer irradiated by the deep ultraviolet light. FIG. 2 is a cross-sectional view illustrating an exemplary embodiment of post-exposure baking apparatus 26c of FIG. 1.

Referring to FIG. 2, post-exposure baking apparatus 26c comprises a chamber 100, a supporting member 200, a heating member 300, and a cooling member 400. Chamber 100 comprises an interior space that may be sealed from the exterior of chamber 100 and houses wafer W in the illustrated embodiment. Chamber 100 comprises a housing 120 and a lid 140. Housing 120 comprises a central space and an opening at its top portion. Lid 140 is disposed at the top portion of housing 120 and is adapted to open and close, thus respectively exposing and covering the inner space of housing 120. An actuator 142 is attached to lid 140 and is adapted to move lid 140 horizontally or vertically. Lid 140 is closed while the baking process is performed and is open while wafer W is being loaded into or removed from chamber 100.

Supporting member 200 is disposed in chamber 100 and adapted to support wafer W. Supporting member 200 comprises a supporting plate 220, wafer guides 240, and supporting protrusions 260. Supporting plate 220 has a circular shape. Wafer guides 240 are disposed on an upper edge of supporting plate 220. About 3 to 8 wafer guides 240 may be disposed at regular intervals around the upper edge of supporting plate 220. Wafer guides 240 guide wafer W into the desired position and prevent wafer W from being dislodged during the execution of the post-exposure baking process. Supporting protrusions 260 are mounted on the upper surface of supporting plate 220 and inside of wafer guides 240 (i.e., nearer to the center of supporting plate 220 than any of wafer guides 240). Supporting protrusions 260 separate wafer W from the upper surface of supporting plate 220.

A lift pin assembly 280 is movably disposed in relation to supporting member 200 and adapted to securely position wafer W on supporting member 200 after wafer W is transported into chamber 100. Lift pin assembly 280 comprises lift pins 282 respectively disposed partially within holes in supporting plate 220. Lift pins 282 are combined with a moving plate 284, and an actuator 286 is adapted to move lift pins 282 and moving plate 284 upward and downward. To mount wafer W securely on supporting member 200, wafer W is placed on lift pins 282 while lift pins 282 protrude from an upper surface of supporting plate 220, and lift pins 282 are then moved downward to mount wafer W securely on supporting member 200.

During a photolithography process using deep ultraviolet light, deep ultraviolet light is irradiated onto various regions of a photoresist layer formed on wafer W. Thus, an acid (e.g., hydrogen) is generated on the surface of the regions of the photoresist layer on which light is irradiated. When wafer W is subsequently heated at a predetermined temperature, the acid generated is amplified and the regions where light was irradiated are changed such that a development liquid may be used to remove those regions using the acid as a catalyst. Hereinafter, each region of the photoresist layer that has been changed such that the region may be removed using a development liquid will be called an "altered photoresist region" (P1 of FIG. 9A), and each of the remaining regions will be called an "unaltered photoresist region" (P2 of FIG. 9A). For a positive photoresist, the altered photoresist regions P1 are removed using a development liquid, and the unaltered photoresist regions P2 remain on the surface of wafer W as a photoresist pattern. When wafer W is heated to a relatively high temperature, the width of each altered photoresist region P1 increases by a relatively large amount because the acid is amplified. When wafer W is heated to a relatively low temperature, the width of each altered photoresist region P1 increases by a relatively small amount because the amplification of the acid is suppressed.

Heating member 300 applies heat to wafer W to amplify the acid. The proper amount of heat is chosen such that the altered photoresist region P1 (see, FIG. 9A) will be formed in such a manner to obtain a central region W1 of wafer W having a desired location and size. In accordance with an exemplary embodiment of the invention, heating member 300 comprises electrical heating wires 320 disposed in supporting plate 220. Electrical heating wires 320 are connected to a power supply unit 340. Heating wires 320 may be, for example, coil-shaped heating wires.

Cooling member 400 cools an edge region W2 of wafer W (see FIG. 9A, etc.) in order to suppress the amplification of the acid at edge region W2 of wafer W. Therefore, referring to FIG. 9A, after a post-exposure baking process during which edge region W2 is cooled, altered photoresist regions P1 of edge region W2 are narrower than they would be after a post-exposure baking process during which edge region W2 is not cooled. Thus, unaltered photoresist regions P2 of edge region W2 (i.e., the regions that form the photoresist pattern after the development process (see FIG. 9B)) are wider after the development process than they would be if edge region W2 were not cooled during the post-exposure baking process. In accordance with an exemplary embodiment of the invention, cooling member 400 cools edge region W2 of wafer W such that edge region W2 has a temperature that is lower than that of central region W1 by about 5° C. to 10° C.

Figure 3:
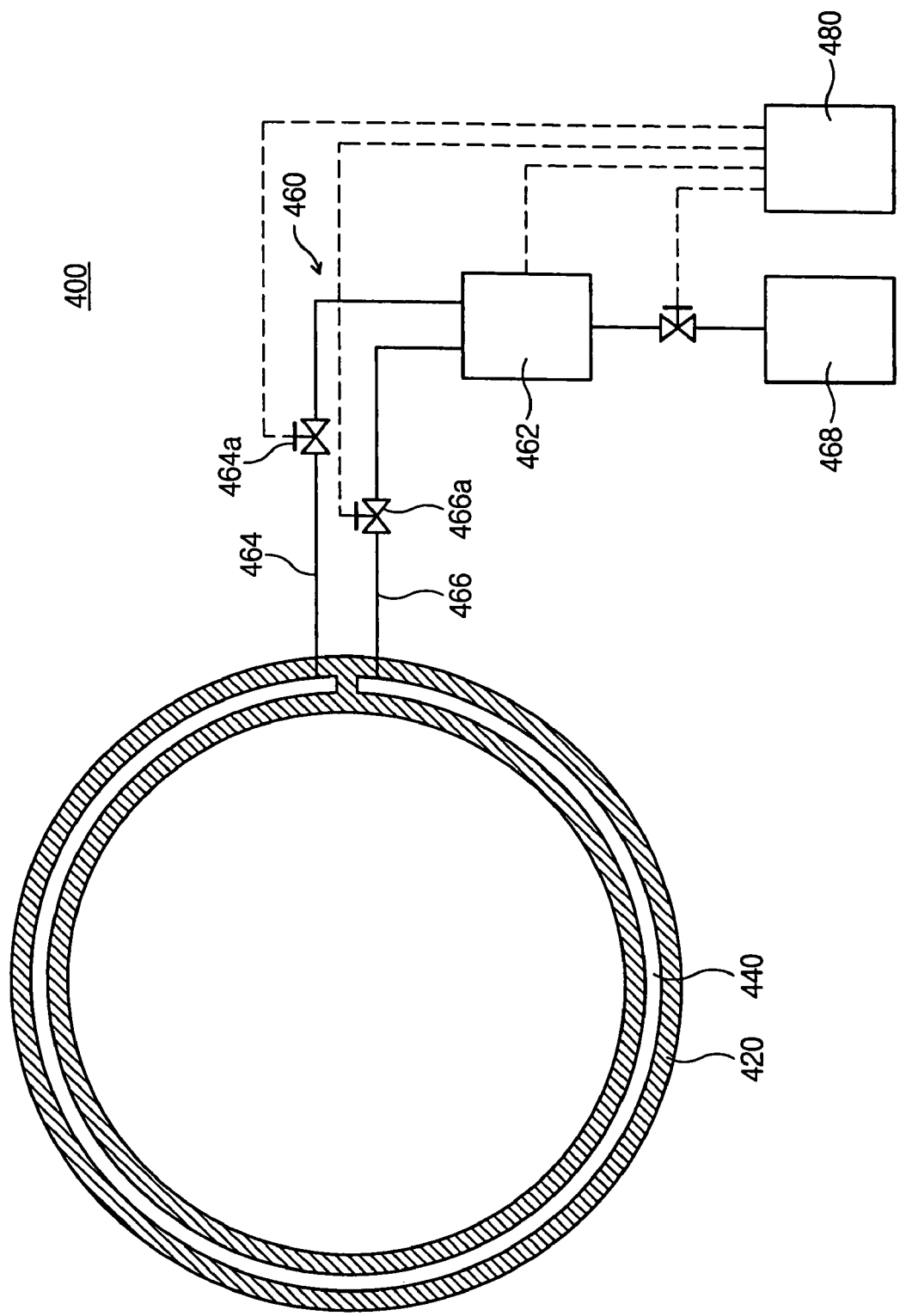
FIG. 3 is a cross sectional view of the cooling member of FIG. 2, wherein the cross section is taken along a plane substantially parallel with the working surface of the wafer of FIG. 2.

An exemplary embodiment of cooling member 400 of post-exposure baking apparatus 26c of FIG. 2 will now be described with reference to FIGS. 2 and 3. FIG. 3 is a cross sectional view of cooling member 400 of FIG. 2, wherein the cross section is taken along a plane substantially parallel with the working surface of wafer W (of FIG. 2). As shown in FIGS. 2 and 3, cooling member 400 comprises a tank 420, a wafer cooling line 440, and a coolant supply 460. As used herein, the term "wafer cooling line" refers to a line through which cooling liquid flows when cooling liquid is supplied to the line. Tank 420 has the shape of a ring and surrounds both supporting member 200 and the circumference of wafer W disposed on supporting member 200. Wafer cooling line 440 is disposed in tank 420 and substantially surrounds the outer edge of wafer W. Alternatively, wafer cooling line 440 may be disposed lower than wafer W. Coolant supply 460 provides a cooling liquid to wafer cooling line 440. Water may be used as the cooling liquid, for example. Coolant supply 460 has a supply pipe 464 connected to one end of wafer cooling line 440 and a withdraw pipe 466 connected to the other end of wafer cooling line 440. Supply pipe 464 and withdraw pipe 466 comprise valves 464a and 466a, respectively. Valves 464a and 466a are adapted to open and close the internal paths of supply pipe 464 and withdraw pipe 466, respectively. Valves 464a and 466a may be, for example, solenoid valves that are opened and closed electrically. Supply pipe 464 and withdraw pipe 466 are each connected to a temperature controller 462. In the illustrated embodiment, a controller 480 controls temperature controller 462 and valves 464a and 466a.

Temperature controller 462 receives the cooling liquid from a coolant storage 468 and controls the temperature of the cooling liquid supplied to wafer cooling line 440. Both the temperature of the cooling liquid and the distance between wafer cooling line 440 and wafer W are set such that cooling member 400 affects only edge region W2 of wafer W, and not central region W1 of wafer W (see FIG. 9A, etc.). The temperature of the cooling liquid may vary in accordance with process condition, such as those related to post-exposure baking apparatus 26c. In this exemplary embodiment, the relevant process conditions comprise the temperature for suppressing the amplification of the acid at edge region W2 of wafer W.

Figure 4:
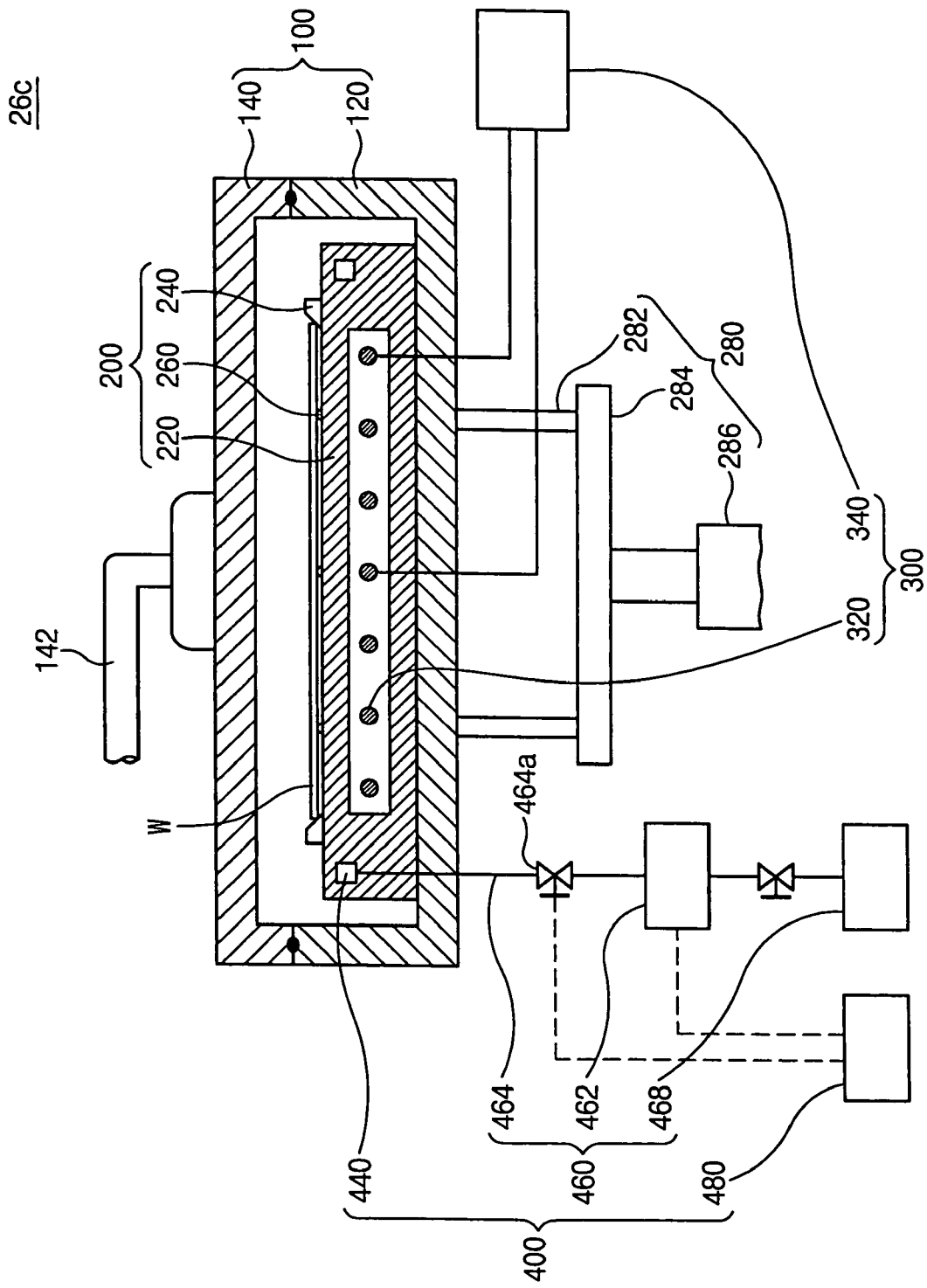
FIG. 4 is a cross-sectional view illustrating another exemplary embodiment of the post-exposure baking apparatus of FIG. 1.

In the exemplary embodiment described above, cooling member 400 comprises tank 420, which surrounds supporting plate 220, and wafer cooling line 440, which is disposed in tank 420. However, as shown in FIG. 4, wafer cooling line 440 may be disposed in supporting plate 220. To minimize the effect of cooling member 400 on central region W1 of wafer W, wafer cooling line 440 is preferably disposed outside of the outer edge of wafer W.

Figure 5:
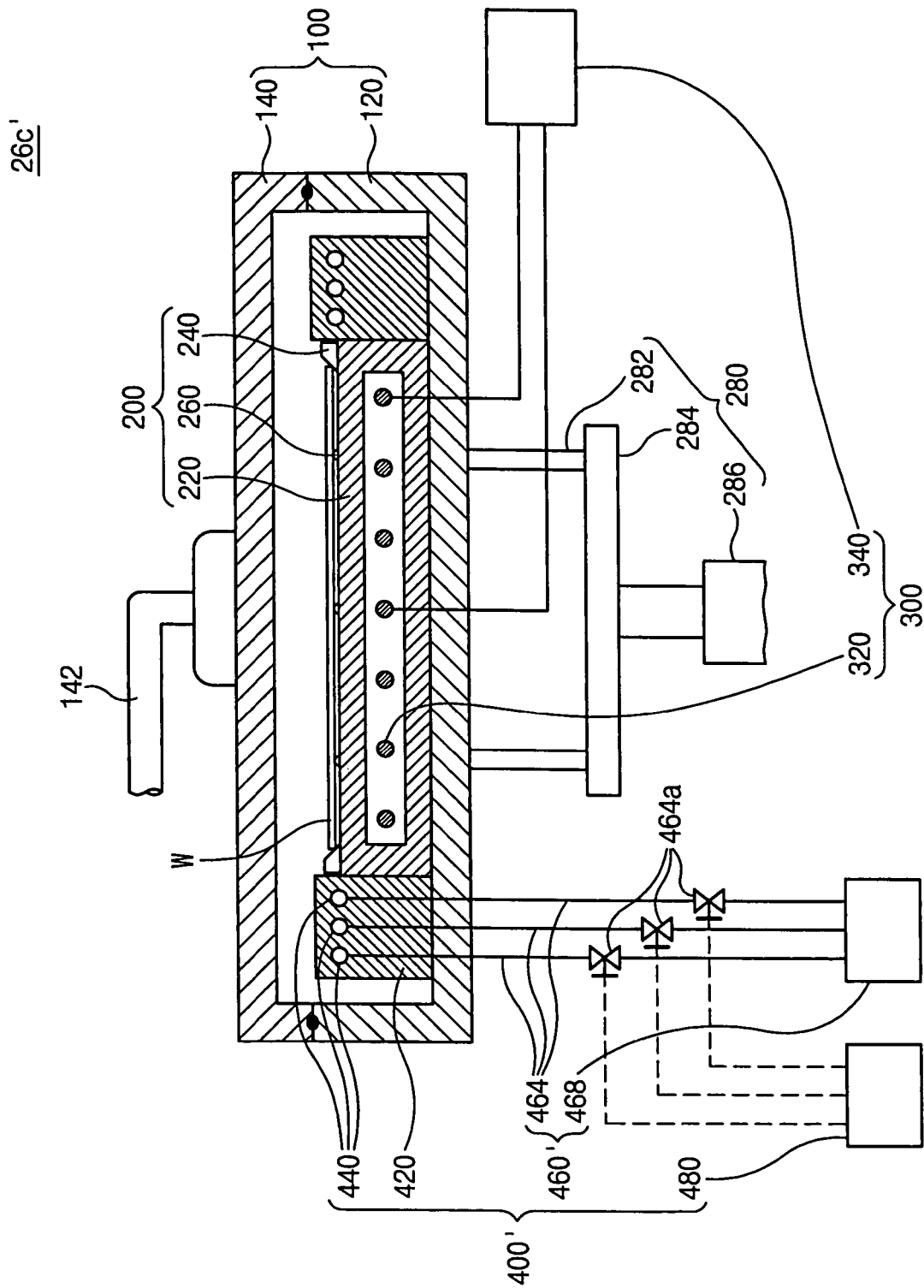
FIG. 5 is a cross-sectional view illustrating another exemplary embodiment of the post-exposure baking apparatus of FIG. 1.
Figure 6:
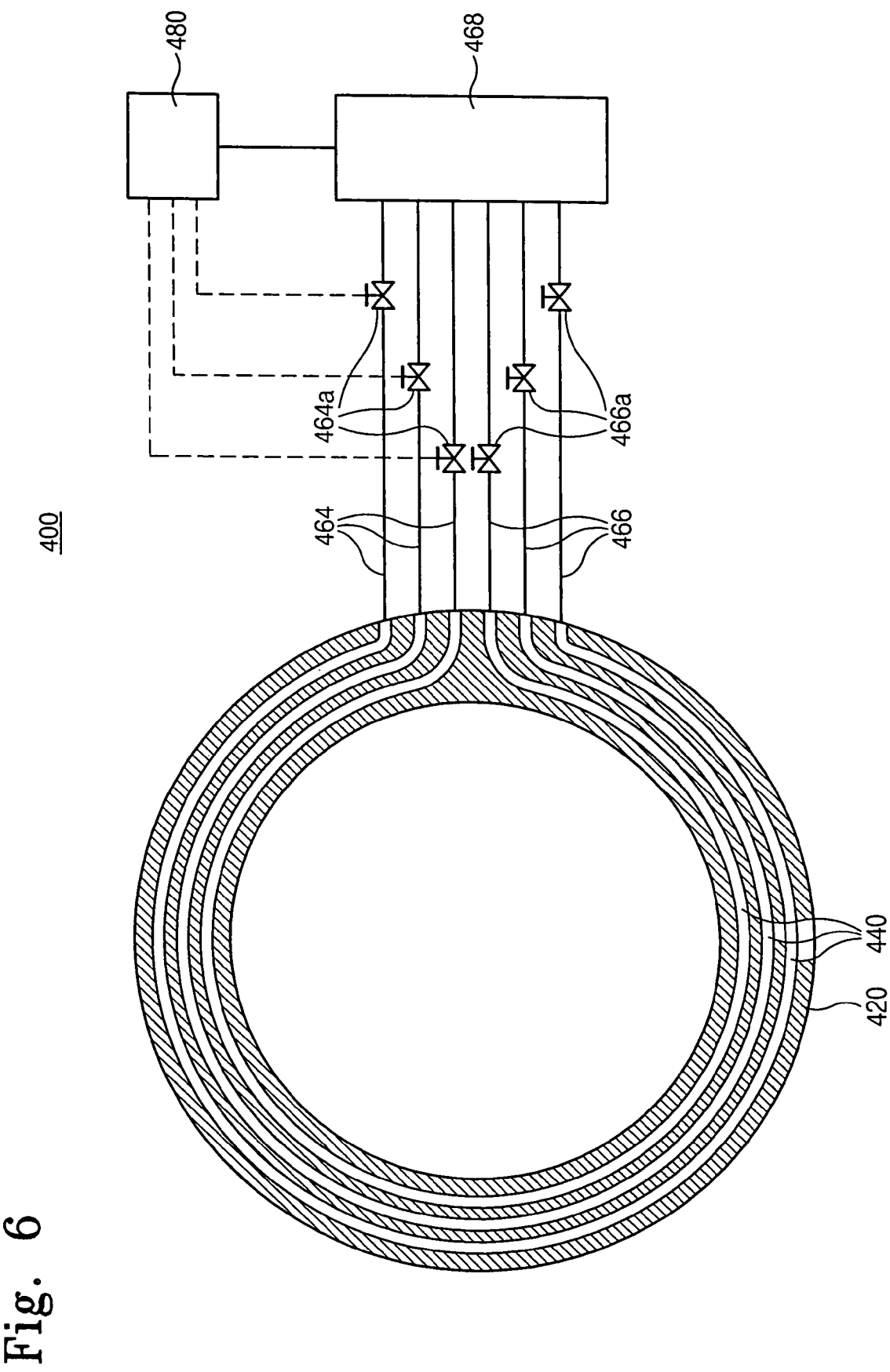
FIG. 6 is a cross-sectional view of the cooling member of FIG. 5, wherein the cross section is taken along a plane substantially parallel with the working surface of the wafer of FIG. 5.

FIGS. 5 and 6 illustrate another exemplary embodiment of cooling member 400. FIG. 5 is a cross-sectional view of a post-exposure baking apparatus 26c'. FIG. 6 is a cross-sectional view of cooling member 500 of FIG. 5, wherein the cross section is taken along a plane substantially parallel with the working surface of wafer W of FIG. 5. Referring to FIGS. 5 and 6, cooling member 400 comprises a tank 420', a plurality of wafer cooling lines 440, and a coolant supply 460'. Tank 420' has a cylindrical shape and surrounds both supporting member 200 and the circumference of wafer W. Wafer cooling lines 440 are disposed in tank 420' and substantially concentrically around wafer W. Each wafer cooling line 440 is disposed at a different radial distance from the center of wafer W than the other wafer cooling lines 440, and each individual wafer cooling line 440 is disposed at a radial distance from the center of wafer W that is substantially the same at most points around that individual wafer cooling line 440. Alternatively, each wafer cooling line 440 may be disposed at a different height within tank 420' (as measured from the bottom surface of tank 420').

Coolant supply 460' provides a cooling liquid to a selected wafer cooling line 440 selected from among the plurality of wafer cooling lines 440. Coolant supply 460' comprises a plurality of supply pipes 464 and a plurality of withdraw pipes 466. Each supply pipe 464 is connected to one end of a respective wafer cooling line 440, and each withdraw pipe 466 is connected to the other end (i.e., not the end to which a supply pipe 464 is connected) of a respective wafer cooling line 440. In addition, each supply pipe 464 comprises a valve 464a adapted to open and close the internal pathway of the corresponding supply pipe 464, and each withdraw pipe 466 comprises a valve 466a adapted to open and close the internal pathway of the corresponding withdraw pipe 466. Valves 464a and 466a are preferably electrically controllable solenoid valves. Supply pipes 464 and withdraw pipes 466 are all connected to coolant storage 468.

A cooling liquid is provided to all wafer cooling lines 440 and the temperature of the cooling liquid is the same for all wafer cooling lines 440. The cooling liquid is preferably water at room temperature. Since each wafer cooling line 440 is disposed at a different distance from wafer W, each wafer cooling line 440 has a different cooling effect on wafer W. A controller 480 adapted to control the opening and closing of valves 464a (and thus, adapted to select a wafer cooling line 440) may be provided in accordance with a process condition. Post-exposure baking apparatus 26c' in one embodiment preferably comprises two (2) to six (6) wafer cooling lines 440. However, any reasonable number of cooling lines 440 may be used.

In post-exposure baking apparatus 26c shown in FIG. 2, the temperature of the cooling liquid is controlled by temperature controller 462. Thus, by supplying cooling liquid having varying temperatures in accordance with process conditions, post-exposure baking apparatus 26c can achieve the desired temperature for edge region W2 of wafer W (see FIG. 9A, etc.). In the illustrated embodiment of FIG. 2, a plurality of wafer cooling lines 440 is not required, so the structure of post-exposure apparatus 26c is simpler than that of post-exposure baking apparatus 26c' of FIG. 5. In post-exposure baking apparatus 26c' of FIG. 5, temperature controller 462 is not necessary because post-exposure baking apparatus 26c' controls the temperature at the edge region W2 of wafer W by selectively supplying cooling liquid to wafer cooling lines 440 in accordance with process conditions.

Figure 7:
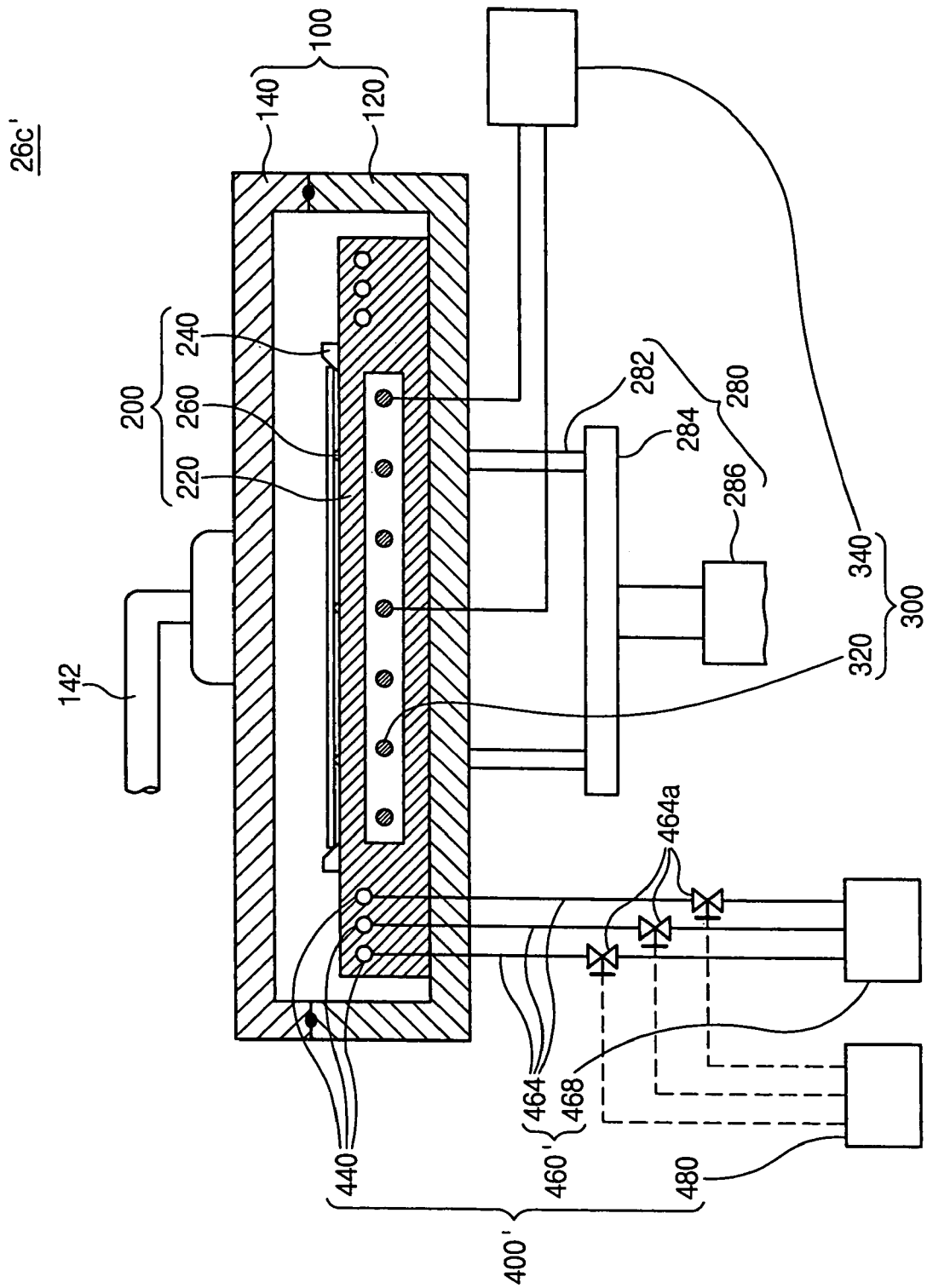
FIG. 7 is a cross-sectional view illustrating another exemplary embodiment of the post-exposure apparatus of FIG. 1.

In exemplary embodiments of the invention described above, cooling member 400 comprises tank 420 (or tank 420') surrounding supporting plate 220, and one or more wafer cooling lines 440 disposed in tank 420 or tank 420', respectively. However, as shown by FIGS. 4 and 7, the one or more wafer cooling lines 440 may be disposed in supporting plate 220. Preferably, wafer cooling line(s) 440 are disposed outside of the outer edge of wafer W to minimize the cooling effect that cooling apparatus 400 has on central region W1 of wafer W (see FIG. 9A, etc.).

Figure 8A:
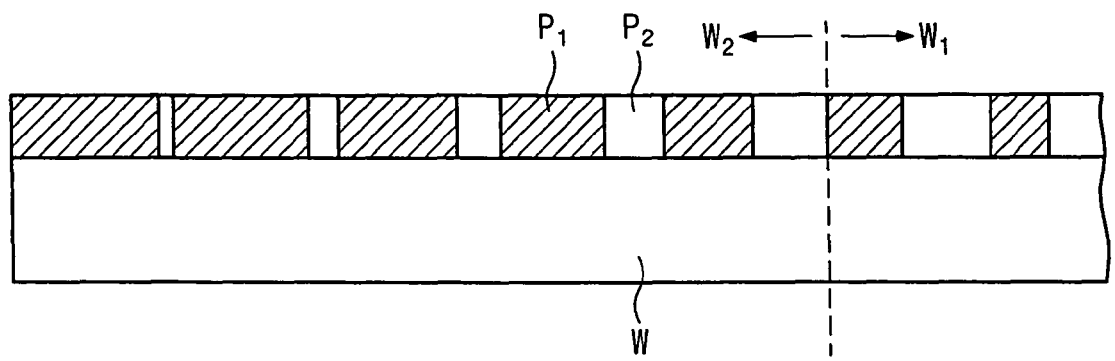
FIGS. 8A and 8B illustrate a wafer, on which a photoresist layer is formed, after a post-exposure baking process that heats the wafer but does not cool an edge of the wafer has been performed on the wafer; and, FIGS. 9A and 9B illustrate a wafer, on which a photoresist layer is formed, after a post-exposure baking process has been performed on the wafer, wherein, during the post-exposure baking process, the wafer is heated while an edge region of the wafer is simultaneously cooled.
Figure 8B:
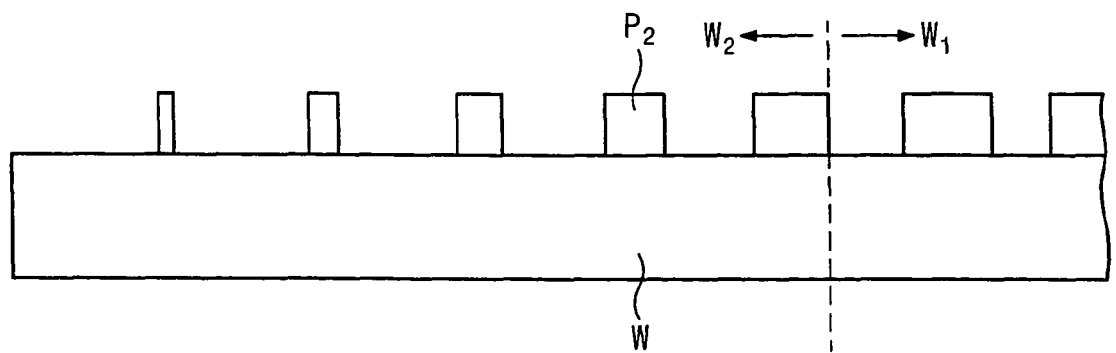

FIGS. 8A and 8B illustrate a wafer W, on which a photoresist layer is formed, after a post-exposure baking process using heating member 300 but not cooling member 400 has been performed on wafer W. For various reasons, light may be irradiated on larger regions of the photoresist layer at an edge region W2 of wafer W than at a central region W1 of wafer W during a photolithography process. This result may occur due to various errors associated with the photolithography process. Thus, when the post-exposure bake process is performed on wafer W using heating member 300 but not cooling member 400, altered photoresist regions P1 of edge region W2 are wider than unaltered photoresist regions P2 of central region W1, as shown in FIG. 8A. In addition, the nearer an unaltered photoresist region P2 is to the edge of wafer W, the narrower is that unaltered photoresist region P2. After altered photoresist regions P1 are formed, altered photoresist regions P1 are removed from wafer W during a development process using a development liquid. As shown in FIG. 8B, unaltered photoresist regions P2 of central region W1 are wide enough to stably remain on wafer W as photoresist patterns. However, unaltered photoresist regions P2 of edge region W2 are too narrow to remain on wafer W. Thus, unaltered photoresist regions P2 are broken during the development process and become loose particles on central region W1 of wafer W.

Figure 9A:
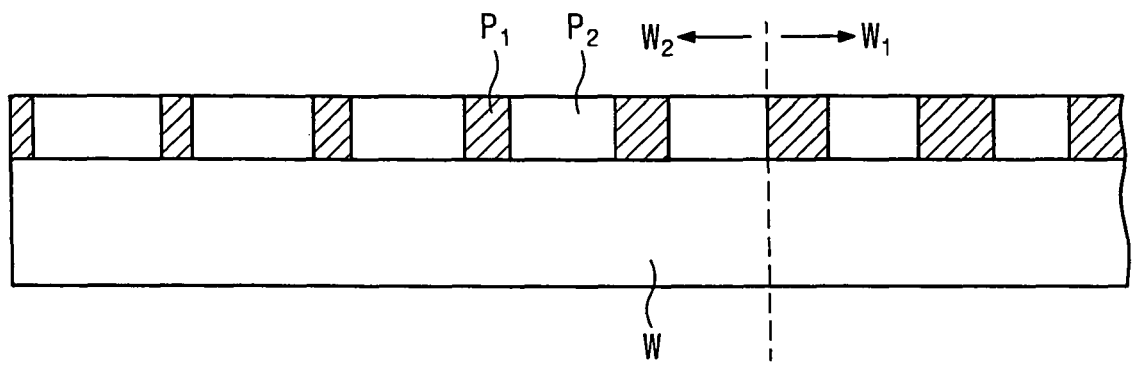
Figure 9B:
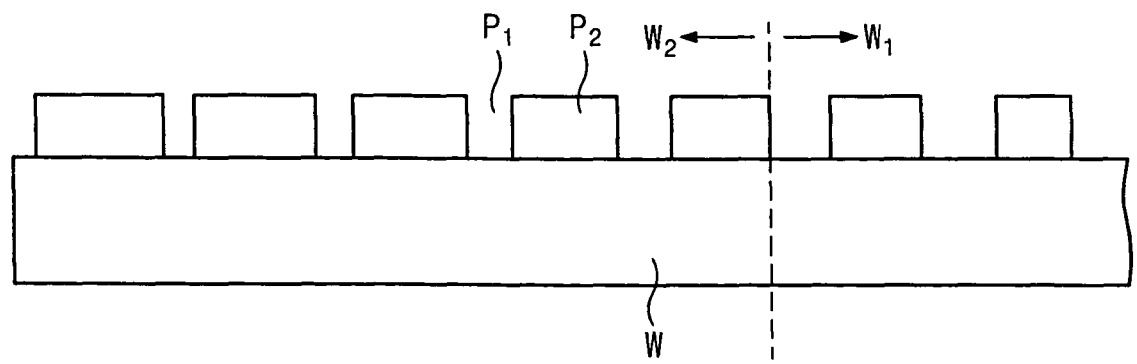

FIGS. 9A and 9B illustrate a wafer W, on which a photoresist layer is formed, after a post-exposure baking process has been performed on wafer W, wherein, during the post-exposure baking process, wafer W is heated while an edge region of wafer W is simultaneously cooled. As shown in FIG. 9A, while altered photoresist regions P1 of central region W1 of wafer W each have a desired width because the heating of wafer W amplifies the acid generated in the photoresist layer, each of the altered photoresist regions P1 of edge region W2 of wafer W is relatively narrow because the amplification of the acid generated in the photoresist layer is suppressed by the cooling of wafer W. Because of the cooling effect of cooling member 400 during the post-exposure baking process, the temperature of edge region W2 is relatively low during the post-exposure baking process, causing the altered photoresist regions P1 in edge region W2 to form narrowly. In addition, the nearer an altered photoresist region P1 is to the edge of wafer W, the narrower is that altered photoresist region P1. Thus, unaltered photoresist regions P2 of edge region W2 are wide enough to stably remain on wafer W as photoresist patterns during the development process, as shown in FIG. 9B. Thus, it is possible to prevent the altered photoresist regions P1 of edge region W2 from becoming loose particles on wafer W.

While the invention has been described with reference exemplary embodiments, it will be apparent to one skilled in the art that various modifications may be made to the exemplary embodiments without departing from the scope of the invention as defined by the accompanying claims.

What is claimed is:

1. A post-exposure baking apparatus comprising:
   a supporting member configured to receive and seat a wafer having a central portion and a surrounding outer edge portion and having a photoresist layer formed thereon;
   a heating member comprising heating wires integrally formed within the supporting member, regularly disposed under only the central portion of the wafer, and configured to heat the wafer to chemically amplify an acid generated in only a portion of the photoresist layer overlaying the central portion of the wafer; and
   a cooling member mechanically separate from the supporting member and comprising a wafer cooling line configured around the perimeter of the supporting member, such that a cooling liquid circulating through the wafer cooling line selectively cools only the outer edge portion of the wafer to suppress the amplification of the acid in a portion of the photoresist layer overlaying the outer edge portion of the wafer while the heating member chemically amplifies the acid in the portion of the photoresist layer overlaying the central portion of the wafer.

2. The apparatus of claim 1, wherein the cooling member further comprises:
   a ring-shaped tank surrounding and disposed in thermal contact with the perimeter of the supporting member, and encompassing the wafer cooling line; and
   a coolant supply configured to supply the cooling liquid to the wafer cooling line via a coolant supply pipe extending through the tank.

3. The apparatus of claim 2, wherein the cooling member further comprises a temperature controller configured to control a temperature of the cooling liquid.

4. The apparatus of claim 2, wherein
the wafer cooling line is disposed coplanar with and proximate to the outer edge portion of the wafer.

5. The apparatus of claim 2, wherein the wafer cooling line comprises:
a plurality of concentrically arranged wafer cooling lines surrounding the outer edge portion of the wafer.

6. The apparatus of claim 5, wherein the cooling liquid is water at room temperature.

7. The apparatus of claim 1, further comprising a hermetically sealable chamber having an interior space housing the wafer.

8. A photolithography system comprising:
a coating apparatus configured to form a photoresist layer on a wafer;
an exposure apparatus configured to selectively expose the photoresist layer using deep ultraviolet light;
a developing apparatus configured to form a photoresist pattern on the wafer using a development liquid; and,
a plurality of baking apparatuses comprising a pre-baking apparatus, a post-exposure baking apparatus, and a hard-baking apparatus,
wherein the post-exposure baking apparatus comprises:
a supporting member configured to receive and seat a wafer having a central portion and a surrounding outer edge portion and having a photoresist layer formed thereon;
a heating member comprising heating wires integrally formed within the supporting member, regularly disposed under only the central portion of the wafer, and configured to heat the wafer to chemically amplify an acid generated in only a portion of the photoresist layer overlaying the central portion of the wafer; and
a cooling member mechanically separate from the supporting member and comprising a wafer cooling line configured around the perimeter of the supporting member, such that a cooling liquid flowing through the wafer cooling line selectively cools only the outer edge portion of the wafer to suppress the amplification of the acid in a portion of the photoresist layer overlaying the outer edge portion of the wafer while the heating member chemically amplifies the acid in the portion of the photoresist layer overlaying the central portion of the wafer.

9. The photolithography system of claim 8,
wherein the cooling member comprises:
a ring-shaped tank encompassing the wafer cooling line and surrounding the outer perimeter of the supporting plate; and,
a coolant supply configured to supply cooling liquid to the wafer cooling line.

10. The photolithography system of claim 9, further comprising a temperature controller configured to control a temperature of the cooling liquid.

11. The photolithography system of claim 8, wherein the cooling liquid is water at room temperature.

12. A post-exposure baking apparatus comprising:
a supporting member configured to receive and seat a wafer including a central portion surrounded by an outer edge portion and having a photoresist layer formed thereon;
a heating member comprising heating wires integrally formed within the supporting member, regularly disposed under only the central portion of the wafer, and configured to heat only the central portion of the wafer to chemically amplify an acid generated in a portion of the photoresist layer overlaying the central portion of the seated wafer; and
a cooling member comprising a wafer cooling line integrally formed within the supporting member and surrounding the heating wires, the wafer cooling line being configured such that a cooling liquid circulating through the wafer cooling line selectively cools only the outer edge portion of the wafer to suppress the amplification of the acid in a portion of the photoresist layer overlaying the outer edge portion of the wafer while the heating member chemically amplifies the acid in the portion of the photoresist layer overlaying the central portion of the seated wafer.

13. The apparatus of claim 12, wherein the cooling member further comprises:
a ring-shaped tank surrounding and in thermal contact with the perimeter of the supporting member and encompassing the wafer cooling line; and
a coolant supply configured to supply the cooling liquid to the wafer cooling line via a coolant supply pipe extending through the tank.

14. The apparatus of claim 13, wherein the cooling member further comprises a temperature controller configured to control a temperature of the cooling liquid.

15. The apparatus of claim 13, wherein the wafer cooling line is disposed within the supporting member above a plane in which the heating wires are disposed and outside the perimeter of the wafer.

16. The apparatus of claim 15, wherein the wafer cooling line comprises a plurality of concentrically arranged wafer cooling lines surrounding the outer edge portion of the wafer.

17. The apparatus of claim 12, wherein the cooling liquid is water at room temperature.

18. The apparatus of claim 12, further comprising a hermetically sealable chamber having an interior space housing the seated wafer.

* * * * *